(12) United States Patent
Wagner et al.

(10) Patent No.: US 11,652,485 B2
(45) Date of Patent: May 16, 2023

(54) ANALOG HASHING ENGINES USING PHYSICAL DYNAMICAL SYSTEMS

(71) Applicant: RAYTHEON BBN TECHNOLOGIES, CORP., Cambridge, MA (US)

(72) Inventors: Andrew Phillips Wagner, Brighton, MA (US); Minh-Hai Nguyen, Cambridge, MA (US); Graham Earle Rowlands, Arlington, MA (US); Guilhem Jean Antoine Ribeill, Arlington, MA (US)

(73) Assignee: RAYTHEON BBN TECHNOLOGIES CORP., Cambridge, MA (US)

( * ) Notice: Subject to any disclaimer, the term of this patent is extended or adjusted under 35 U.S.C. 154(b) by 0 days.

(21) Appl. No.: 17/574,429

(22) Filed: Jan. 12, 2022

(65) Prior Publication Data

US 2022/0294452 A1 Sep. 15, 2022

Related U.S. Application Data

(60) Provisional application No. 63/160,428, filed on Mar. 12, 2021.

(51) Int. Cl.
*H04L 9/00* (2022.01)
*H03K 19/17736* (2020.01)
*G09B 23/18* (2006.01)
*H03K 19/195* (2006.01)

(52) U.S. Cl.
CPC ..... *H03K 19/17744* (2013.01); *G09B 23/183* (2013.01); *H03K 19/1774* (2013.01); *H03K 19/195* (2013.01)

(58) Field of Classification Search
CPC ............ G09B 23/183; H03K 19/1774; H03K 19/17744; H03K 19/195
See application file for complete search history.

(56) References Cited

U.S. PATENT DOCUMENTS 6,980,656 B1 * 12/2005 Hinton, Sr. ........... H04L 27/001
  380/263
9,425,799 B2 * 8/2016 Ditto ................ H03K 19/17728
11,394,391 B2 * 7/2022 Ignjatovic ............. H03M 1/201
(Continued)

OTHER PUBLICATIONS

Bahi et al.(2012) "Quality Analysis of a Chaotic Proven Keyed Hash Function," Int'l Jour. on Advances in Internet Tech., vol. 5, No. 1 & 2, pp. 26-32.

(Continued)

*Primary Examiner* — Kurtis R Bahr
(74) *Attorney, Agent, or Firm* — Lewis Roca Rothgerber Christie LLP

(57) ABSTRACT

An analog hashing system and method includes: an input port for accepting an input signal; a chaotic circuit including non-linear components and multiple chaotic attractors for generating an unpredictable output responsive to the input signal; a differential output port coupled to the chaotic circuit for producing an analog differential signal from the unpredictable output; and a clock circuit for producing a binary output, as a hash function, generated by the sign of the analog output in every clock cycle.

20 Claims, 4 Drawing Sheets

(56) References Cited

U.S. PATENT DOCUMENTS

2017/0085367 A1* 3/2017 Fernández ............... G06F 1/04

OTHER PUBLICATIONS

Odame et al. (2005) "The translinear principle: a general framework for implementing chaotic oscillators," Journal of Bifurcation and Chaos, vol. 15, No. 8, pp. 2559-2568.
O'Donoghue et al. (2005) "A fast and simple implementation of Chua's oscillator using a "cubic-like" Chua diode," Kennedy & Forbes; Proceedings of the 2005 European Conference on Circuit Theory and Design.
Matsumoto et al. (1985) "The Double Scroll," IEEE Trans. on Circuits and Systems, vol. CAS-32, No. 8, pp. 798-818.
Ahmad et al. (2005) "Hardware implementation analysis of SHA-256 and SHA-512 algorithms on FPGAs;" Computers and Electrical Engineering 31, pp. 345-360.

* cited by examiner

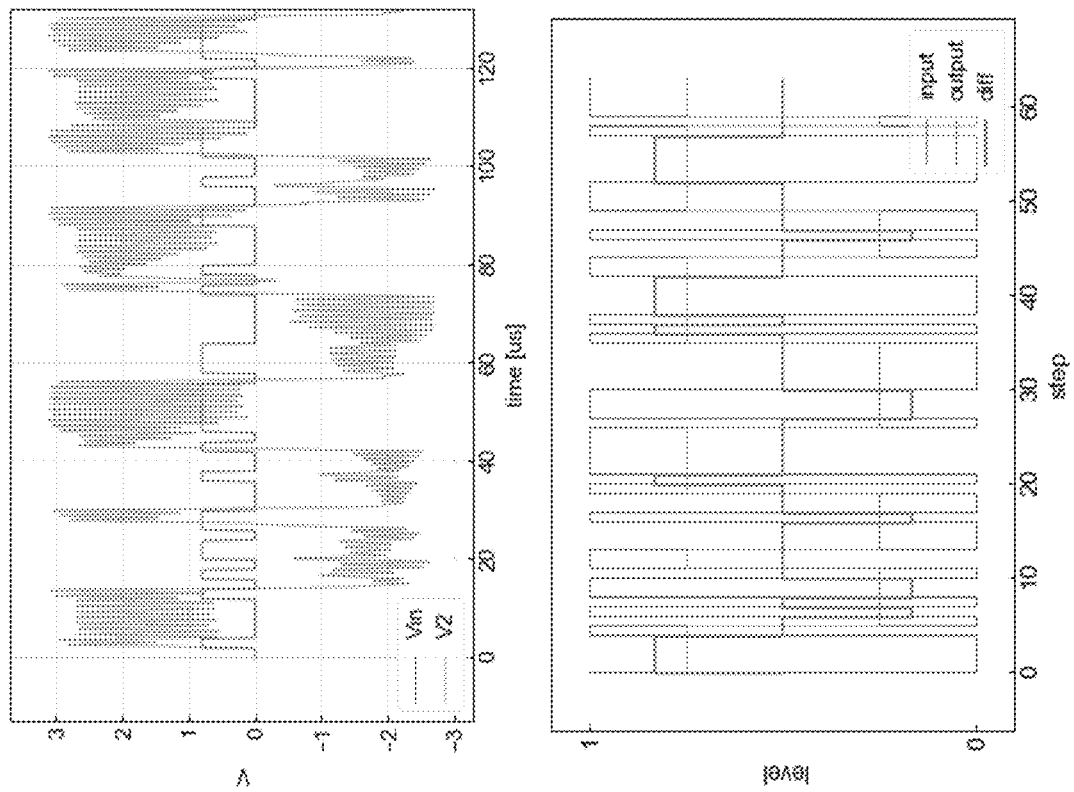
FIG. 3B
FIG. 3C
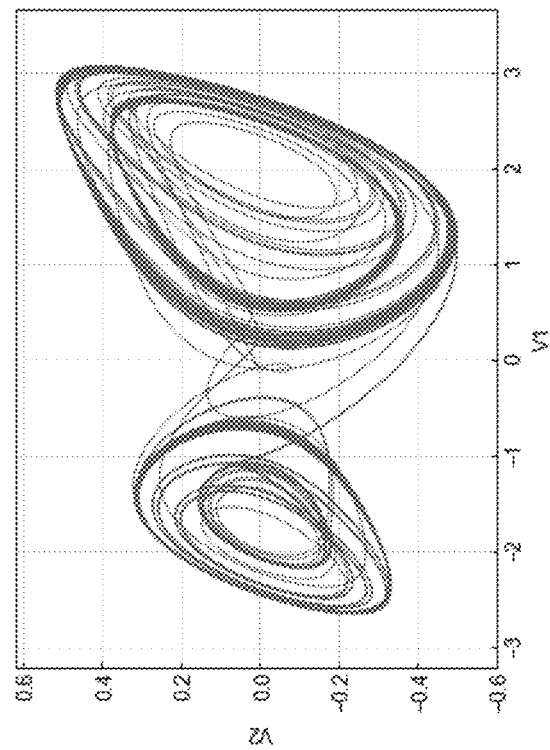
FIG. 3A

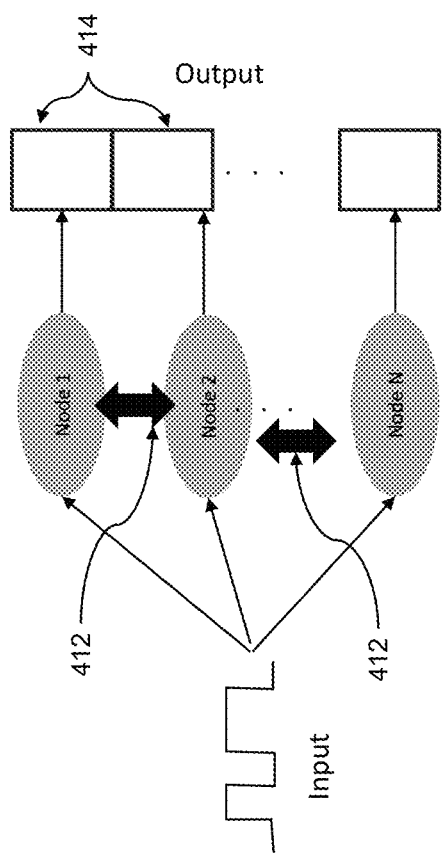
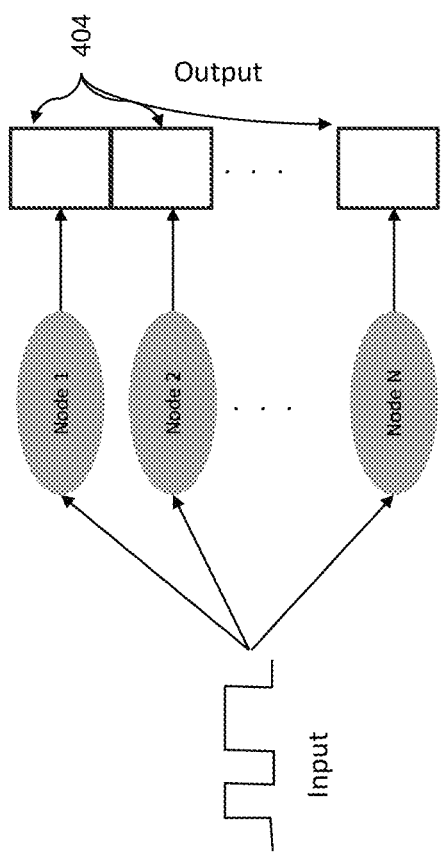
FIG. 4B
FIG. 4A

ANALOG HASHING ENGINES USING PHYSICAL DYNAMICAL SYSTEMS

CROSS-REFERENCE TO RELATED APPLICATIONS

This patent application claims the benefits of U.S. Provisional Patent Application Ser. No. 63/160,428, filed on Mar. 12, 2021, and entitled "Analog Hashing Engines Using Physical Dynamical Systems," the entire content of which is hereby expressly incorporated by reference.

FIELD OF THE INVENTION

The disclosed invention relates generally to cryptography and hashing systems and more specifically to analog hashing engines using physical dynamical systems.

BACKGROUND

Hashing functions are ubiquitous in computing, communications, and cyber security. Current state-of-the-art (SOTA) hashing algorithms, such as SHA-1, -2 and -3, follow recurrent computing architectures, such as Merkel-Damgard construction and Sponge construction, which can be described as high-level (e.g., block-level) ordinary differential equations (ODEs). These SOTA hashing algorithms use hash engines to implement such architectures by designing algorithms with digital operations, then translate them to CMOS circuits, at Application Specific Integrated Circuit (ASIC), Field programmable Gate Array (FPGA) or Central Processing Unit (CPU) level, depending on specific applications. While these approaches give the designer ultimate control over the components of the hashing algorithms, their execution at digital CMOS blocks suffers from latency (many clock cycles per operation cycle), energy and footprint (due to large circuits).

This construction is very popular in hashing. One critical issue is collision, for example, the ODE responds more to the recent input ("force") than the past ones, so data having similar "tails" end up the same hash. A well-known software reservoir model is "Echo State Network" (ESN), which is a simple first-order ODE with a matrix coefficient. The problem above can be described as the network's "short-term memory." In reservoir computing, because the reservoir's responses are recorded all the time, a short memory is preferred. In hashing, one needs the opposite, the memory must be infinitely long, because only the final state is recorded.

The ESN's memory can be represented by its matrix coefficient's "spectral radius". If it is near zero, its memory is short (desirable in reservoir computing). If it's above 1, the network is a closed loop amplifier and will blow up, or at best it responds too strongly to the initial input and runs into the same collision problem. For hashing, it is desired to have it as 1. In some embodiments, an ASIC reservoir (embedded in the chip with many physical parameters that hackers can't figure out without running near impossibly extensive circuit simulation, given that they somehow obtain a blue print). Therefore, the ASIC reservoir includes a "spectral radius"=1. However, spectral radius is not well defined for ASIC reservoir because its ODE is too complicated.

Therefore, there is a need for a hashing engine with higher speed, lower power consumption and smaller footprint.

SUMMARY

In some embodiments, the present disclosure is directed to an analog hashing engine that includes: an input port for accepting an input signal; a chaotic circuit including non-linear components and multiple chaotic attractors for generating an unpredictable output responsive to the input signal; a differential output port coupled to the chaotic circuit for producing an analog differential signal from the unpredictable output; and a clock circuit for producing a binary output, as a hash function, generated by the sign of the analog output in every clock cycle.

In some embodiments, the present disclosure is directed to an analog method for generating a hash function. The method includes: accepting an input signal; generating an unpredictable output responsive to the input signal, by a chaotic circuit including non-linear components and multiple chaotic attractors; generating an analog differential signal from the unpredictable output; and producing a binary output, as a hash function, generated by the sign of the analog output.

The input signal may be an analog signal or a digital signal. In some embodiments, the chaotic circuit is a Chua circuit. In some embodiments, the chaotic circuit may include one or more of MOSFET components, magnetic components, optical components and superconducting components.

In some embodiment the analog hashing engine may include an analog-to-digital converter (ADC) coupled to the differential output port and the clock circuit for converting the analog differential signal to a digital bit stream. In some embodiment the analog hashing engine may include a sequence generator for producing sequences of X number of digital bits from the digital bit stream, wherein X constitutes a length of the hash function.

In some embodiment the analog hashing engine may include a second chaotic circuit including non-linear components and multiple chaotic attractors couple to the chaotic circuit. The second chaotic circuit may be coupled to the chaotic circuit by one or more of a resistor and a capacitor, or not coupled to the chaotic circuit. The second chaotic circuit and the chaotic circuit may be configured in a parallel or serial topology.

BRIEF DESCRIPTION OF THE DRAWINGS

A more complete appreciation of the disclosure, and many of the attendant features and aspects thereof, will become more readily apparent as the disclosure becomes better understood by reference to the following detailed description when considered in conjunction with the accompanying drawings in which like reference symbols indicate like components.

FIG. 3A is a bifurcation diagram illustrating the chaotic behavior of the analog hashing engine 200, according to some embodiments of the present disclosure.

FIG. 3B shows a graph of both the input signal Vin and the output differential signal V2, over time in micro-seconds, according to some embodiments of the present disclosure.

FIG. 3C shows a graph of input signal, output signal, and output differential signal V2, over time in micro-seconds, according to some embodiments of the present disclosure.

FIG. 4A depicts an analog hashing engine, according to some embodiments of the present disclosure.

FIG. 4B shows an analog hashing engine, according to some embodiments of the present disclosure.

DETAILED DESCRIPTION

In some embodiment, the present disclosure discloses approaches to implement hashing functions by utilizing complex and rich internal dynamics of physical systems. The internal dynamics of physical systems or components, includes their transfer functions over time. Typically, the transfer function and the time derivative of the transfer function are used to quantify the dynamics of the system. The disclosure takes advantage of complex dynamics occurring naturally within the physical systems, either single-device or multi-device level, to implement the ODEs for hashing applications. The disclosure describes two approaches to design and optimize such physical systems as analog hashing engines: (1) exploit the internal dynamics of a single device (e.g., FIG. 2 and related figures), and (2) utilize the topology and coupling of multiple devices (e.g., FIGS. 4A and 4B and related figures). The hardware platforms suitable to realize this invention include, but not limited to: MOSFETs, optical, magnetic and superconducting devices and networks. By leveraging internal dynamics of devices, hardware implementations of hashing engines based on this invention can deliver higher speed, lower power consumption and smaller footprint than those of current state-of-the-art digital CMOS hashing circuits.

Figure 1:
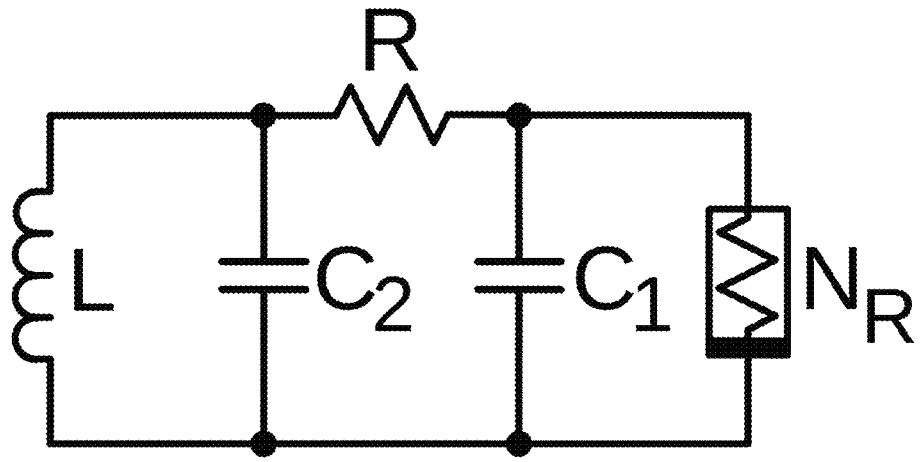
FIG. 1 shows a Chua circuit, according to prior art.

FIG. 1 shows a Chua circuit, according to prior art. As shown, this simple electronic circuit exhibits chaotic behavior. In other words, the circuit is a nonperiodic oscillator that produces an oscillating waveform that, unlike an ordinary electronic oscillator, never repeats itself. The circuit includes one or more nonlinear elements, one or more locally active resistors and three or more energy-storage elements. As illustrated $N_R$ is a nonlinear negative resistance, which is typically made of a circuit containing an amplifier with positive feedback.

As shown, the energy storage elements are two capacitors (C1 and C2) and an inductor (L). R is an active negative resistor that can amplify signals and provides the power to generate an oscillating current. The negative resistor R and nonlinearity are combined in the device $N_R$. The nonlinear resistor may be implemented by two linear resistors and two diodes. The negative resistor R may be implemented by a negative impedance converter made from three linear resistors and an operational amplifier.

This circuit operates in a chaotic region and may have sequences of values for an evolving variable that exactly repeat themselves, giving periodic behavior starting from any point in that sequence. However, such periodic sequences are repelling, that is, if the evolving variable is outside the sequence, it will not enter the sequence and in fact, will diverge from it. Thus, for almost all initial conditions, the variable evolves chaotically with non-periodic behavior.

In some embodiments, the approach uses internal dynamics of physical devices as processors (so-called "in materio computing"), instead of elaborate algorithms running on CMOS digital gates. This way, the approach extends the platforms for hashing engines to optical, magnetic, superconducting and other forms of semiconductor devices, not limited to CMOS technology as the SOTAs. The use of analog elements in this invention allows the processing of multi-valued or float point variables with minimal overhead, instead of binary operations as in the SOTAs.

In some embodiments, the analog hashing engine approach includes a dynamical system that is comprised of a single physical device or a network of coupled devices. The dynamical system can operate in bifurcated regimes or chaotic regimes, as long as its operation is deterministic and sufficiently robust against noise. The dynamics of the system can be tuned to satisfy the operational requirements of specific applications. Tuning may include selecting the optimal values for the linear components, none-linear components and/or external (voltage) biases. In the case of a network of coupled devices, tuning may include adjusting the coupling between devices.

Example implementations of analog hashing engine include but not limited to:
  a. A single-node dynamical system includes a Chua oscillator operating in bifurcated regimes;
  b. An uncoupled parallel network of Chua oscillators in bifurcated regimes;
  c. Replace Chua oscillator in a. and b. above by other MOSFET devices;
  d. A resistively or inductively coupled Josephson transmission line;
  e. Other optical, mechanical or magnetic devices; or
  f. Topology of the network: parallel, serial, circular; fully connected or sparse.

Figure 2:
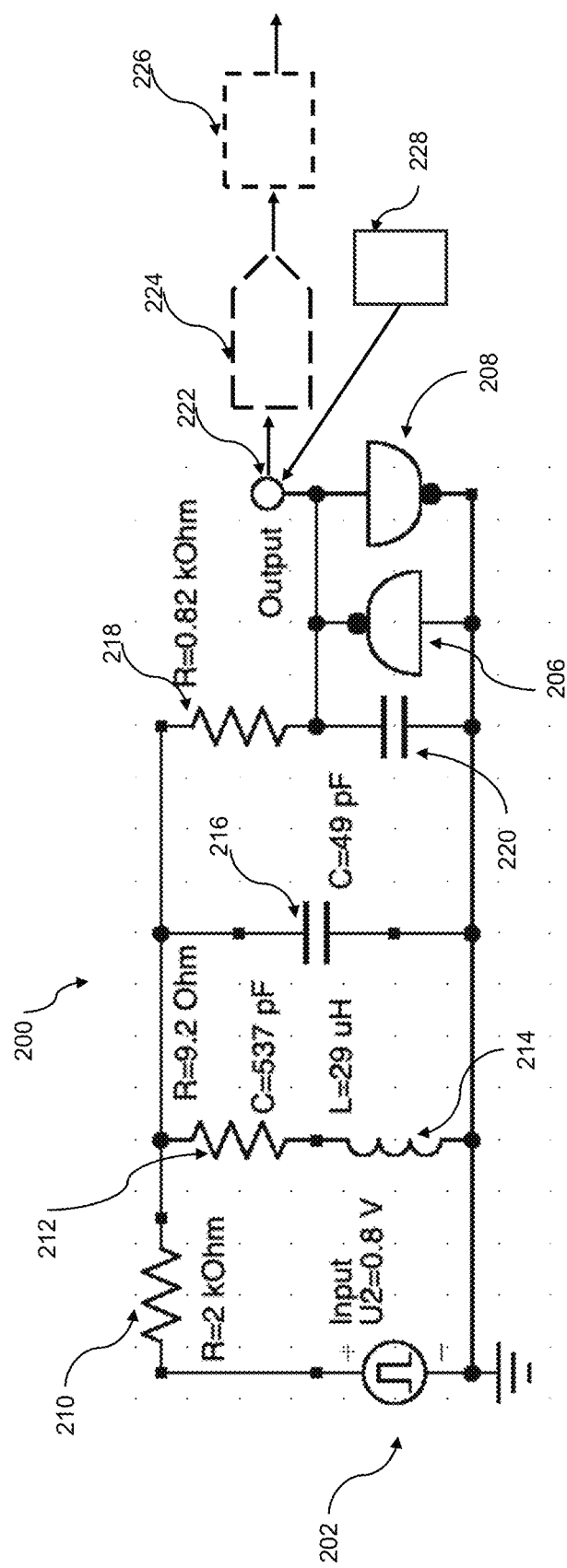
FIG. 2 illustrates an analog hashing engine, according to some embodiments of the present disclosure.

FIG. 2 illustrates an analog hashing engine 200, according to some embodiments of the present disclosure. As shown, an input signal is input, via an input port 202, to a chaotic circuit that includes non-linear components, resistors 210, 212 and 213; capacitors 2167 and 220; and an inductor 214. The input signal may be an analog signal or a digital signal. A differential output port including two invertors 206 and 208 at the output of the chaotic circuit produce an analog differential signal 222, for example, a voltage signal. This chaotic circuit behave similarly of the Chua circuit in FIG. 1. In this example, the input signal 202 is a binary input with signal level of, for example, 0.80 V and the analog output 222 produces a binary output, which is a binary output generated by the sign of the analog output in every clock cycle (generated by a clock circuit 228), eliminating any analog-to-digital converters (ADC). Consequently, the analog output 222 depends on the input signal in an unpredictable way, resulting in a fast and efficient generation of a hash function based on the input signal 202.

In some embodiments, the analog hashing engine 200 may include an analog-to-digital converter (ADC) 224. That coverts the analog differential signal output 222 to a sequence of digital bits. A sequence generator 226 produces sequences of X number of digital bits as the hash function 204. The number of digital bits in the sequence, X, constitutes the length of the hash function and depends on the application of the hash function.

In these embodiments, the analog hashing engine 200 replaces the elaborate design of minute operations in hashing algorithms with optimizing of the internal dynamics of the (non-linear) devices and their coupling and topology and therefore shifting the implementation focus to finding and optimizing the devices and their networks, the dynamics of which are inherently and sufficiently complex, fast and robust against noise since, if the hashing engine (dynamical system) is not robust to noise the output will not be reproducible.

Although a chaotic circuit similar to Chau circuit is used as an example of a circuit with chaotic behavior that includes multiple chaotic attractors and non-linear components, other known similar circuits may be used to implement the analog hashing engine of the present disclosure. Other circuits with multiple attractors are described in Odame, K. M., and, B. M. I. J. of B. & 2005; "The translinear principle: A general framework for implementing chaotic oscillators; *World Scientific* 15, 2559-2568 (2011), the entire contents of which is herein expressly incorporated by reference.

Moreover, such dynamical systems are abundant in nature, include but not limited to mechanical, optical, magnetic and electronic devices and their networks. By implementing hashing ODEs at the device level, utilizing the device's internal dynamics which occurs naturally and very fast, the approach of the present disclosure results in faster, smaller and more energy efficient hashing engines (e.g., single-device or multi-device circuits). The internal dynamics of the devices, includes their transfer functions over time.

FIG. 3A is a bifurcation diagram illustrating the chaotic behavior of the analog hashing engine 200, according to some embodiments of the present disclosure. As known in the art, bifurcation occurs when a small smooth change made to parameter values (the bifurcation parameters) of a system causes a sudden 'qualitative' or topological change in the system's behavior. Bifurcations occur in both continuous systems (e.g., described by ODEs) and discrete systems (described by maps).

This bifurcation diagram shows the values visited or approached asymptotically (chaotic attractors) of the chaotic circuit of the analog hashing engine 200, as a function of a bifurcation parameter in the circuit. The chaotic circuit beaves as a self-oscillator with complex dynamics, which is tuned to two attractors around +/−1.5V output (e.g., 22 in FIG. 2). Two exemplary attractors are shown in FIG. 3A.

FIG. 3B shows a graph of both the input voltage Vin and the output differential voltage V2, over time in micro-seconds, according to some embodiments of the present disclosure. As shown in this example of a hashing operation, the input voltage is a binary signal with voltage level of 0.80 and the output differential voltage V2 depends on the input signal 202 in an unpredictable and non-linear way, with different waveforms and different times.

FIG. 3C shows a graph of input voltage 202, output voltage 22, and output differential voltage V2, over time in micro-seconds, according to some embodiments of the present disclosure. FIG. 3C highlights the difference between input and output ("diff" curve in the figure). As depicted, the output is different than input about 50% of the time so the input and output are uncorrelated.

In some embodiments, if the system is a network of devices, in addition to tuning the dynamics of individual devices, the topology of the devices (nodes) can also be designed for specific applications. For example, it may be possible to construct hashing functions that are evenly distributed in their output or "universal" or hash functions that map similar inputs to similar outputs or "locality sensitive". A network of devices would also expand the dimensionality of the analog hash engine and therefore make the hash function more robust and less prune to reversing it. Optionally, depending on the application, a DAC and/or ADC may be used for data input and output to/from the system. In some embodiments of a network of coupled devices, tuning may include adjusting the coupling between devices.

FIG. 4A depicts an analog hashing engine, according to some embodiments of the present disclosure. As shown, a plurality (N) of circuit with chaotic behavior and including multiple chaotic attractors and non-linear components (denoted by Node 1 to Node N) that are operating in bifurcated modes are used to construct an analog hashing engine. In these embodiments, Nodes 1 to N are uncoupled and the input signal is applied to each Node in parallel. In some embodiments, each node may be a Chau circuit. The outputs are a series of digital bits 404 at the end of each input sequence, in this case, the output of Node 1 being the last state read.

FIG. 4B shows an analog hashing engine, according to some embodiments of the present disclosure. In these embodiments, the neighboring "Nodes" are coupled by a linear or non-linear capacitor or resistor 412. Coupling the nodes this way permits an extra degree of freedom to tune the performance of the hashing circuit.

In various embodiments, topology of the coupling network of the nodes in FIGS. 4A and 4B may be configured as parallel, serial, circular, fully connected or sparse.

It will be recognized by those skilled in the art that various modifications may be made to the illustrated and other embodiments of the invention described above, without departing from the broad inventive scope thereof. It will be understood therefore that the invention is not limited to the particular embodiments or arrangements disclosed, but is rather intended to cover any changes, adaptations or modifications which are within the scope and spirit of the invention as defined by the appended claims.

The invention claimed is:

1. An analog hashing engine comprising:
an input port for accepting an input signal;
a chaotic circuit including non-linear components and multiple chaotic attractors for generating an unpredictable output responsive to the input signal;
a differential output port coupled to the chaotic circuit for producing an analog differential signal from the unpredictable output; and
a clock circuit for producing a binary output, as a hash function, generated by the sign of the analog output in every clock cycle.

2. The analog hashing engine of claim 1, wherein the input signal is an analog signal.

3. The analog hashing engine of claim 1, wherein the input signal is a digital signal.

4. The analog hashing engine of claim 1, wherein the chaotic circuit is a Chua circuit.

5. The analog hashing engine of claim 1, wherein the chaotic circuit include MOSFET components.

6. The analog hashing engine of claim 1, wherein the chaotic circuit include magnetic components.

7. The analog hashing engine of claim 1, wherein the chaotic circuit include optical components.

8. The analog hashing engine of claim 1, wherein the chaotic circuit include superconducting components.

9. The analog hashing engine of claim 1, further comprising an analog-to-digital converter (ADC) coupled to the differential output port and the clock circuit for converting the analog differential signal to a digital bit stream.

10. The analog hashing engine of claim 9, further comprising a sequence generator for producing sequences of X number of digital bits from the digital bit stream, wherein X constitutes a length of the hash function.

11. The analog hashing engine of claim 1, further comprising a second chaotic circuit including non-linear components and multiple chaotic attractors couple to the chaotic circuit.

12. The analog hashing engine of claim 11, wherein the second chaotic circuit is coupled to the chaotic circuit by one or more of a resistor and a capacitor.

13. The analog hashing engine of claim 11, wherein the second chaotic circuit is not coupled to the chaotic circuit.

14. The analog hashing engine of claim 11, wherein the second chaotic circuit and the chaotic circuit are configured in a parallel or serial topology.

15. An analog method for generating a hash function, the method comprising:
- accepting an input signal;
- generating an unpredictable output responsive to the input signal, by a chaotic circuit including non-linear components and multiple chaotic attractors;
- generating an analog differential signal from the unpredictable output; and
- producing a binary output, as a hash function, generated by the sign of the analog output.

16. The method of claim 15, wherein the input signal is an analog signal.

17. The method of claim 15, wherein the input signal is a digital signal.

18. The method of claim 15, wherein the chaotic circuit is a Chua circuit.

19. The method of claim 15, wherein the chaotic circuit include optical components.

20. The method of claim 15, wherein the chaotic circuit include superconducting components.

* * * * *